US007277551B2

(12) United States Patent
Miura et al.

(10) Patent No.: US 7,277,551 B2
(45) Date of Patent: Oct. 2, 2007

(54) SOUND REPRODUCING APPARATUS AND SOUND REPRODUCING METHOD

(75) Inventors: Masayoshi Miura, Chiba (JP); Susumu Yabe, Tokyo (JP)

(73) Assignee: Sony Corporation, Tokyo (JP)

( * ) Notice: Subject to any disclaimer, the term of this patent is extended or adjusted under 35 U.S.C. 154(b) by 347 days.

(21) Appl. No.: 10/933,117

(22) Filed: Sep. 2, 2004

(65) Prior Publication Data

US 2005/0078839 A1 Apr. 14, 2005

(30) Foreign Application Priority Data

Sep. 2, 2003 (JP) ............................ 2003-310030

(51) Int. Cl.
*H03G 5/00* (2006.01)

(52) U.S. Cl. ............................ 381/98; 381/97; 381/77; 381/78; 381/17

(58) Field of Classification Search ............ 381/97–99, 381/58, 1, 17–18, 300, 310, 61, 77–79
See application file for complete search history.

(56) References Cited

U.S. PATENT DOCUMENTS

| | | | | |
|---|---|---|---|---|
| 4,769,848 | A * | 9/1988 | Eberbach | 381/97 |
| 4,885,782 | A | 12/1989 | Eberbach | |
| 5,119,420 | A * | 6/1992 | Kato et al. | 381/1 |
| 5,668,884 | A * | 9/1997 | Clair et al. | 381/82 |
| 2002/0186854 | A1* | 12/2002 | Hosoi et al. | 381/99 |
| 2003/0021433 | A1* | 1/2003 | Lee | 381/302 |
| 2003/0190047 | A1* | 10/2003 | Aarts | 381/310 |
| 2003/0210800 | A1* | 11/2003 | Yamada et al. | 381/310 |
| 2004/0032955 | A1* | 2/2004 | Hashimoto et al. | 381/18 |
| 2004/0105550 | A1* | 6/2004 | Aylward et al. | 381/17 |
| 2004/0105559 | A1* | 6/2004 | Aylward et al. | 381/103 |

FOREIGN PATENT DOCUMENTS

| | | |
|---|---|---|
| JP | 59-053000 | 3/1984 |
| JP | 5-23700 | 3/1993 |
| JP | 06-311582 | 11/1994 |
| JP | 10-55174 | 2/1998 |
| JP | 2001-069599 | 3/2001 |
| JP | 2001-321564 | 11/2001 |
| WO | WO 02/078388 A2 | 10/2002 |

* cited by examiner

*Primary Examiner*—Vivian Chin
*Assistant Examiner*—Disler Paul
(74) *Attorney, Agent, or Firm*—Wolf, Greenfield & Sacks, P.C.

(57) ABSTRACT

A sound reproducing apparatus includes a low-frequency sound reproducing unit for reproducing and outputting a low-frequency sound having a frequency of a predetermined frequency or less; a high-frequency sound reproducing unit for reproducing and outputting a high-frequency sound including a frequency component having a frequency higher than the predetermined frequency; and a reproduction-and-output timing control unit for reproducing and outputting the high-frequency sound reproduced and output by the high-frequency sound reproducing unit behind the low-frequency sound reproduced and output by the low-frequency sound reproducing unit by a predetermined time period.

4 Claims, 6 Drawing Sheets

1

SOUND REPRODUCING APPARATUS AND SOUND REPRODUCING METHOD

BACKGROUND OF THE INVENTION

1. Field of the Invention

The present invention relates to a sound reproducing apparatus and a sound reproducing method for reproducing audio signals as sounds.

2. Description of the Related Art

Heretofore, various sound-effect technologies that achieve target sound localization at an appropriate listening position are employed in sound reproduction systems using a plurality of speakers.

For example, two-channel intensity-control stereophonic reproduction systems or multi-channel surround-sound stereophonic reproduction systems are known.

In the former stereophonic reproduction systems, target sound localization is achieved at a certain listening position, that is, at a listening position that forms a regular triangle together with right-side and left-side speakers.

With the stereophonic reproduction systems described above, reproduced sounds reaching the ears of listeners at the positions other than an appropriate listening position are significantly different from reproduced sounds reaching the ears of listeners at the appropriate listening position. That is, target sound localization cannot be achieved at positions other than the appropriate listening position.

The above problem will now be described with reference to FIGS. 5A to 5C.

FIGS. 5A to 5C illustrate the relationship between an arrangement of speakers and binaural response characteristics of listeners at listening positions.

Referring to FIG. 5A, two speakers (left speaker SL and right speaker SR) are arranged at the right and left sides in front of listeners.

Sounds that reach the ears of a listener at a listening position A at equal distances from the two speakers SL and SR are shown in FIG. 5B. Specifically, a left sound L1 from the left speaker SL reaches the left ear of the listener at the listening position A and a right sound R1 from the right speaker SR reaches the right ear of the listener at the listening position A. In this case, the left sound L1 from the left speaker SL reaches the ears of the listener substantially simultaneously with the right sound R1 from the right speaker SR. The listener at the listening position A perceives a sound image as if it were at a sound-image position a near the center of the two speakers SL and SR.

At this time, a right sound R2 from the right speaker SR is detoured to the left ear of the listener at the listening position A, and a left sound L2 from the left speaker SL is detoured to the right ear of the listener. Accordingly, the right sound R2 reaches the left ear of the listener behind the left sound L1, and the left sound L2 reaches the right ear of the listener behind the right sound R1.

In contrast, sounds that reach the ears of a listener at a listening position B on the right side of the listening position A in FIG. 5A are shown in FIG. 5C. Specifically, the left sound L1 from the left speaker SL reaches the left ear of the listener at the listening position B and the right sound R1 from the right speaker SR reaches the right ear of the listener at the listening position B.

Also at this time, the right sound R2 from the right speaker SR reaches the left ear of the listener at the listening position B, and the left sound L2 from the left speaker SL reaches the right ear of the listener.

Since the right sound R2 from the right speaker SR is detoured to the left ear of the listener at the listening position B and the left sound L2 from the left speaker SL is detoured to the right ear of the listener, the right sound R2 reaches the left ear of the listener behind the left sound L1, and the left sound L2 reaches the right ear of the listener behind the right sound R1. However, the sound R2 reaches the left ear of the listener at a time different from the time when the sound L2 reaches the right ear of the listener because the distance from the left speaker SL to the listener at the listening position B is different from the distance from the right speaker SR to the listener at the listening position B.

Since the listening position B is nearer to the right speaker SR than the listening position A, as shown in FIG. 5A, the right sound R1 reaches the right ear of the listener at the listening position B earlier than the left sound L1 that reaches the left ear of the listener at the listening position B.

In this case, for the listener at the listening position B, the sound image is localized at the position of the right speaker SR owing to the precedence effect achieving the sound-image localization closer toward the right sound R1 that first reaches the right ear of the listener at the listening position B. That is, the listener at the listening position B obtains a sound image at a sound-image position b different from a sound-image position a where the listener at the listening position A obtains a sound image. However, since the left sound from the left speaker SL actually differs from the right sound from the right speaker SR in level or the like, the listener at the listening position B perceives the sound-image position as if it were localized closer toward the right speaker SR.

As described above, in the arrangement shown in FIG. 5A, the listener at the listening position A that is at equal distances from the two speakers SL and SR perceives that the sound image is localized at the target position a, whereas the listener at the listening position B different from the listening position A perceives the sound image as if it were localized at the sound-image position b different from the sound-image position a of the listening position A. In other words, with known stereophonic reproduction systems, the listener at a position different from the listening position A cannot perceive that a sound image is localized at the target sound-image position a.

FIGS. 6A to 6C illustrate the relationship between another arrangement of speakers and the binaural response characteristics of listeners at listening positions, as a comparison with the arrangement of speakers shown in FIGS. 5A to 5C.

Referring to FIG. 6A, one speaker SC is arranged at the center in front of listeners. Sounds C1 from the speaker SC reaching the ears of a listener at a listening position A that is located substantially in front of the speaker SC are shown in FIG. 6B. Referring to FIG. 6B, the sounds C1 from the speaker SC substantially simultaneously reach the right and left ears of the listener at the listening position A. In this case, a sound-image position c coincides with the position of the speaker SC.

In contrast, sounds from the speaker SC reaching the ears of a listener at a listening position B on the right side of the listening position A in FIG. 6A are shown in FIG. 6C. Referring to FIG. 6C, the sound C1 from the speaker SC first reaches the left ear of the listener at the listening position B, and the sound C1 reaches the right ear of the listener after it reaches the left ear of the listener. However, the listener at the listening position A obtains the same sound-image position c as the listener at the listening position B. In other words, the sound-image position is invariable even if the listening position of the listener is changed.

As shown in FIGS. 5A to 6C, speakers that output sounds having different wavefront shapes sound different. That is, speakers sound different in accordance with the arrangement of the speakers and the listening positions. This is because different sound-pressure waveforms are transmitted to the eardrums of a listener when the listener hears sounds from the speaker with his auditory organ, such as the head or the auricle.

A method of outputting sounds from a speaker to reproduce a target sound field is disclosed in Japanese Unexamined Patent Application Publication No. 2-114799. This publication discloses a technique in which arranging speakers at intervals that are not more than half of a wavelength of a maximum spatial frequency of a sound wave and reproducing sounds causes the reproduced sounds to be diffused and to interfere with each other in order to form a wavefront close to an original sound field.

This publication also discloses a technique of picking up sounds for reproducing a wavefront close to an original sound field when speakers are arranged at intervals that are not more than half of a wavelength of a maximum spatial frequency of a sound wave and the sounds are reproduced.

Technologies, relating to the present invention, for appending delayed signals for complementing the sound volume without changing the sound-image position perceived by a listener are disclosed in Japanese Unexamined Patent Application Publications No. 9-149500 and No. 10-243500. However, reproduction of wavefront is not discussed in these two publications.

In the reproducing device disclosed in Japanese Unexamined Patent Application Publication No. 2-114799, it is necessary to set an interval between speakers to a value not more than half of a wavelength of a maximum reproduction frequency (maximum spatial frequency) of a sound field to be reproduced.

Accordingly, multiple speakers must be arranged at short intervals in order to reproduce a sound field across a wide band from several tens of hertz to several tens of kilohertz.

For example, in order to reproduce sounds having a frequency of 17 kHz with speakers and to reproduce a sound field, the speakers must be arranged at intervals of 1 cm and, therefore, it is impossible to actually arrange the speakers at such intervals.

Hence, with the reproducing device disclosed in Japanese Unexamined Patent Application Publication No. 2-114799, it is difficult to output sound waves across a wide band from lower frequencies to higher frequencies by using one wavefront and there is a problem in that a sound field cannot be reproduced across a wide band including higher frequencies.

SUMMARY OF THE INVENTION

In order to solve the problems described above, it is an object of the present invention to provide a sound reproducing apparatus and a sound reproducing method capable of reproducing a target sound field across a wide band.

The present invention provides, in its first aspect, a sound reproducing apparatus including a low-frequency sound reproducing unit for reproducing and outputting a low-frequency sound having a frequency of a predetermined frequency or less; a high-frequency sound reproducing unit for reproducing and outputting a high-frequency sound including a frequency component having a frequency higher than the predetermined frequency; and a reproduction-and-output timing control unit for reproducing and outputting the high-frequency sound reproduced and output by the high-frequency sound reproducing unit behind the low-frequency sound reproduced and output by the low-frequency sound reproducing unit by a predetermined time period.

The present invention provides, in its second aspect, a sound reproducing method including a low-frequency sound reproducing step of reproducing and outputting a low-frequency sound having a frequency of a predetermined frequency or less; a high-frequency sound reproducing step of reproducing and outputting a high-frequency sound including a frequency component having a frequency higher than the predetermined frequency; and a reproduction-and-output timing control step of reproducing and outputting the high-frequency sound reproduced and output in the high-frequency sound reproducing step behind the low-frequency sound reproduced and output in the low-frequency sound reproducing step by a predetermined time period.

With the structure described above, reproducing low-frequency sounds having frequencies not more than a predetermined frequency so as to form sound wavefront for reproducing a desired sound field allows the desired sound field to be reproduced across a wide listening range for the low-frequency sounds. Reproducing high-frequency sounds having the same sound source as the low-frequency sounds behind the low-frequency sounds with a delay unit enables listeners within a range in which the listener can hear the low-frequency sounds to perceive the sound images of the high-frequency sounds at the sound-image position of the sound field reproduced by the low-frequency sounds.

According to the present invention, a desired sound field can be reproduced across a wide listening range for the low-frequency-sounds. Reproducing high-frequency sounds having the same sound source as the low-frequency sounds behind the low-frequency sounds enables listeners within a range in which the listener can hear the low-frequency sounds to perceive the sound images of the high-frequency sounds at the sound-image position of the sound field reproduced by the low-frequency sounds. Hence, it is possible to reproduce a sound field across a wide band from lower frequencies to higher frequencies.

DESCRIPTION OF THE PREFERRED EMBODIMENTS

Embodiments of the present invention will be described below with reference to the attached drawings.

An audiovisual (AV) system functioning as a sound reproducing apparatus of the present invention is exemplified in the embodiments.

Figure 1:
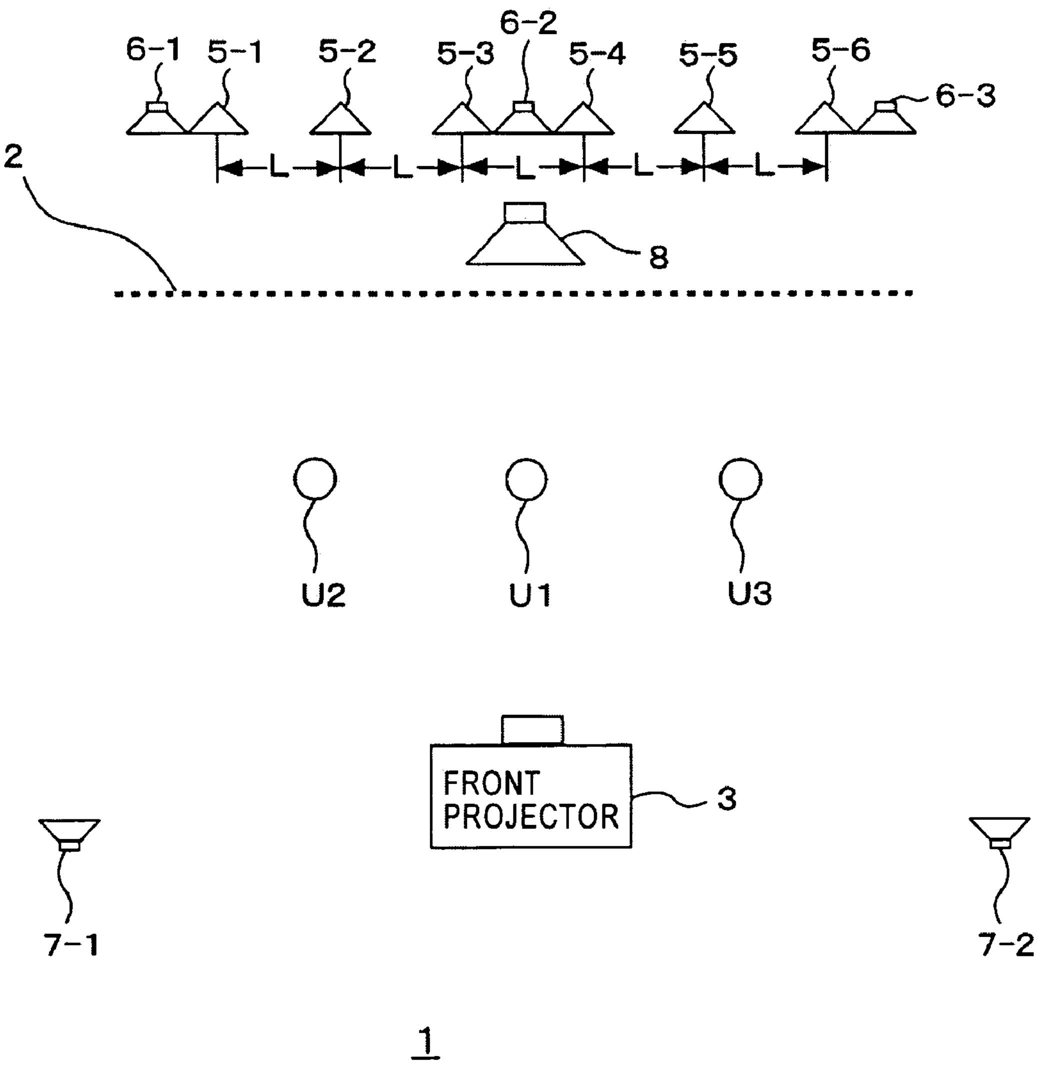
FIG. 1 is a top view showing an arrangement example of speakers in an AV system 1 according to an embodiment of the present invention.

FIG. 1 is a top view showing an example of the arrangement of speakers in an AV system 1 according to an embodiment of the present invention.

Referring to FIG. 1, the AV system 1 has a screen 2 and a front projector 3 for displaying pictures on the screen 2. A low-frequency speaker system 5 and a high-frequency speaker system 6 are provided behind the screen 2, and in front of these, an ultra-low-frequency speaker (subwoofer) 8 is provided in the center behind the screen 2.

A wideband speaker system 7 is provided behind listeners U (U1, U2, and U3) in the AV system 1.

The low-frequency speaker system 5 constituting low-frequency-sound reproducing means is a speaker array including a plurality of low-frequency speakers 5-1, 5-2, . . . capable of reproducing sounds of low to medium frequencies, for example, ranging from several tens of hertz to 3 kHz.

The multiple low-frequency speakers 5-1, 5-2, . . . are arranged at intervals L (L denotes a distance (length)).

The interval L should be set to a length not more than half of a wavelength λ, which is determined based on a maximum reproduction frequency (maximum spatial frequency) among the frequencies of sounds reproduced by the low-frequency speakers 5-1, 5-2, . . . . The low-frequency speakers 5-1, 5-2, . . . may be arranged at different intervals.

For example, when the maximum reproduction frequency of the low-frequency speakers 5-1, 5-2, . . . is set to 3 kHz to reproduce sounds having low to medium frequencies, the low-frequency speakers 5-1, 5-2, . . . are arranged at intervals of 5.6 cm or less.

An interval between the low-frequency speakers 5-1, 5-2, . . . , that is, a maximum reproduction frequency of the speakers is actually determined in consideration of the size of each of the low-frequency speakers 5-1, 5-2, . . . and so on.

Although the multiple low-frequency speakers 5-1, 5-2, . . . in the low-frequency speaker system 5 are arranged in parallel to the screen 2 at predetermined intervals L in FIG. 1, the low-frequency speakers 5-1, 5-2, . . . may be arranged perpendicular to the screen 2 at intervals of L or less.

The high-frequency speaker system 6 constituting high-frequency-sound reproducing means includes three high-frequency speakers 6-1, 6-2, and 6-3 capable of reproducing high-frequency sounds having, for example, frequencies of 3 kHz or more. The high-frequency speakers 6-1, 6-2, and 6-3 are provided at the left side, at the center, and at the right side, respectively, behind the screen 2. Although the high-frequency speaker system 6 includes the three high-frequency speakers 6-1, 6-2, and 6-3 in FIG. 1, this structure is shown merely as an example. The high-frequency speaker system 6 preferably includes four or more high-frequency speakers.

The wideband speaker system 7 includes two wideband speakers 7-1 and 7-2 capable of reproducing wideband sounds having, for example, frequencies ranging from several tens of hertz to several tens of kilohertz.

The wideband speakers 7-1 and 7-2 in the wideband speaker system 7 are provided at the left and right sides, respectively, behind the listeners U in the AV system 1 shown in FIG. 1 in order to realize surround-sound reproduction. Rear surround sounds are output from the wideband speaker system 7.

The ultra-low-frequency speaker 8 is a speaker capable of reproducing ultra-low-frequency sounds having, for example, frequencies of 200 Hz or less. The ultra-low-frequency speaker 8 is provided in front of the listeners U in the AV system 1 shown in FIG. 1 in order to realize the surround-sound reproduction.

In the AV system 1 of this embodiment, the interval L between the low-frequency speakers 5-1, 5-2, . . . provided in front of the listeners U is set to a length not more than half of the wavelength λ, which is determined based on a maximum reproduction frequency (maximum spatial frequency) that can be reproduced by the low-frequency speakers 5-1, 5-2, . . . , as described above. Each of the low-frequency speakers 5-1, 5-2, . . . outputs a low-frequency sound corresponding to a sound field to be reproduced.

In this case, the low-frequency sounds output from the low-frequency speakers 5-1, 5-2, . . . in the low-frequency speaker system 5 are diffused around the low-frequency speakers 5-1, 5-2, . . . , are interfered with each other, and are synthesized to form one wavefront. The formation of one wavefront permits reproduction of a target sound field. When the sound field is reproduced in this manner, a listening range having the same sound-image position can be expanded.

The low-frequency sounds output from the low-frequency speakers 5-1, 5-2, . . . in the low-frequency speaker system 5 should be low-frequency sounds that can reproduce a target sound field when they are synthesized.

For example, sounds that are picked up by the technology disclosed in Japanese Unexamined Patent Application Publication No. 2-114799, that is, low-frequency sounds that are picked up in an arrangement in which microphones are arranged at the same intervals L as in the low-frequency speakers 5-1, 5-2, . . . in the low-frequency speaker system 5 may be used. Alternatively, low-frequency sounds generated by using low-frequency sound signals that are generated from signals generated by using a method mentioned in Takeda et al., "Ta-chaneru supika saisei wo motiita hamengosei ni kansuru kento (Study of Wavefront Synthesis by Multi-channel Speaker Reproduction)", Acoustical Society of Japan Koen Ronbun-shu, 407-408, September 2000 may be used.

In contrast, the high-frequency speaker system 6 controls the sound-image position by, for example, adjusting a ratio of output levels from the high-frequency speakers 6-1, 6-2, and 6-3 to output high-frequency sounds. The high-frequency speakers 6-1, 6-2, and 6-3 are not arranged at intervals that are less than or equal to half of the wavelength determined based on a maximum reproduction frequency, unlike the low-frequency speakers 5-1, 5-2, . . . Accordingly, it is not possible to form a wavefront for reproducing a target sound field for the high-frequency sounds, unlike the low-frequency sounds described above.

However, in the AV system 1 of this embodiment, the reproduction timing of the high-frequency sounds reproduced by the high-frequency speaker system 6 is set to be behind the reproduction timing of the low-frequency sounds reproduced by the low-frequency speaker system 5 by several milliseconds to several tens of milliseconds. The delay time in this case is set to a time period during which the high-frequency sounds reproduced behind do not reach the ears of the listeners U as acoustic echoes (echo sounds) of the low-frequency sounds.

As described above, according to the AV system 1 of this embodiment, the target low-frequency sounds are reproduced by the low-frequency speakers 5-1, 5-2, . . . with the interval L between the low-frequency speakers 5-1, 5-2, . . . in the low-frequency speaker system 5 being set to a length not more than half of the wavelength λ, which is determined based on a maximum spatial frequency that can be reproduced by the low-frequency speakers 5-1, 5-2, . . . , so that a target sound field is reproduced across a wide listening range for the low-frequency sounds.

In addition, the reproduction timing of the high-frequency sounds reproduced by the high-frequency speaker system 6 is set to be behind the reproduction timing of the low-frequency sounds reproduced by the low-frequency speaker system 5 by a predetermined delay time.

As a result, it is possible to reproduce a target sound field across a wide bandwidth from lower frequencies to higher frequencies in the AV system 1 of this embodiment for the following reasons.

A study conducted by the inventors and others shows that, when the band of sounds originating from the same sound source is divided into subbands and the sounds in the divided subbands are output from different positions at different timings, a listener hears the sounds as if a sound source were located at a position from which the sound having a bandwidth component that has reached the ears of the listener first is output. That is, the study shows that the listener hears sounds that are output from different positions and that reach the ears of the listener behind as if they were localized at the position from which the sound having a bandwidth component that has reached the ears of the listener first is output.

In other words, when sounds originating from the same sound source are divided into low-frequency components and high-frequency components, outputting the low-frequency components first determines a sound field where the sound source is located based on the sounds corresponding to the low-frequency components.

Referring to FIG. 1, since a wavefront is formed such that a target sound source is reproduced based on the low-frequency components and the high-frequency components are output so as to be behind the low-frequency components, the high-frequency components reach the ears of the listener behind the low-frequency components. Accordingly, the listener hears that the high-frequency components are localized at the same position as the low-frequency components. That is, the listener hears that the sound field of the high-frequency components output from the high-frequency speakers is reproduced in the same manner as in the low-frequency components output from the low-frequency speakers.

As a result, the listener hears the sounds as if a wavefront were formed so as to reproduce a target sound field across a wide bandwidth from lower frequencies to higher frequencies.

Hence, it is possible to reproduce a target sound field by reproducing the sound field based on the low-frequency sounds reproduced by the low-frequency speaker system 5 and outputting the high-frequency sounds behind the low-frequency sounds at least within a period during which the high-frequency sounds do not reach the ears of the listeners U as the echo sounds of the low-frequency sounds, even without reproducing a target sound field based on the high-frequency sounds reproduced by the high-frequency speaker system 6.

An example of a structure for realizing the AV system 1 described above will now be described.

First, an example of the data structure of a recording medium serving as a sound source in the AV system 1 described above will be described.

Video data, caption data, and audio data that are multiplexed are recorded in the recording medium.

In this case, audio data reproduced by wavefront reproduction, which corresponds to the low-frequency speakers 5-1, 5-2, . . . in the low-frequency speaker system 5 and the high-frequency speakers 6-1, 6-2, and 6-3 in the high-frequency speaker system 6, and audio data reproduced by surround-sound reproduction, which corresponds to the wideband speakers 7-1 and 7-2 in the wideband speaker system 7 and the ultra-low-frequency speaker 8, are multiplexed and recorded in the recording medium.

Figure 2:
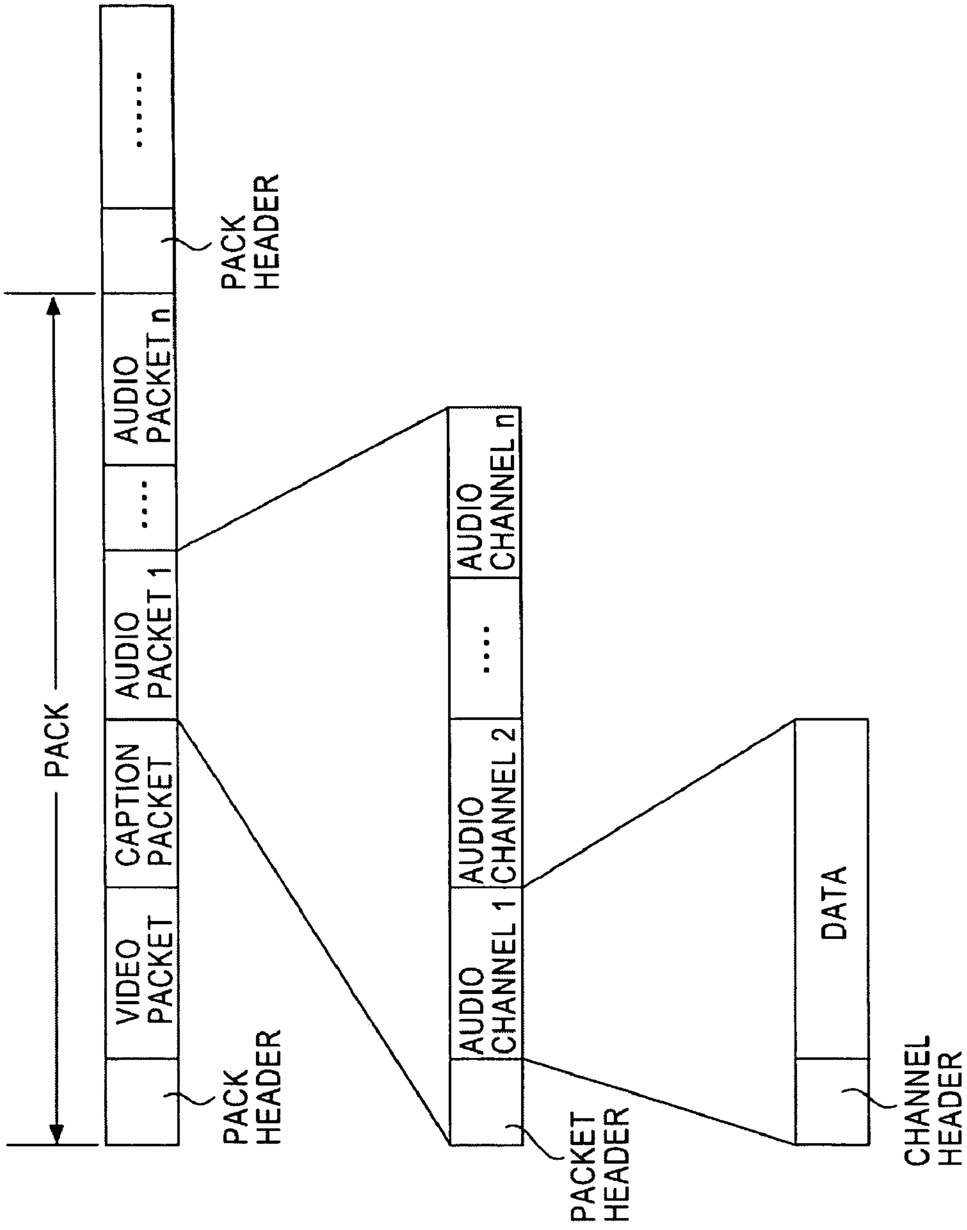
FIG. 2 schematically shows a data structure multiplexed in a sound source.

FIG. 2 schematically shows a data structure multiplexed in a sound source.

Referring to FIG. 2, the recording medium has a pack including, for example, a video packet, a caption packet, and a plurality of audio packets 1, 2, . . . and n. The recording medium has a pack header appended to the head thereof. The pack header contains, for example, additional information used as a reference for use in synchronous reproduction.

Each of the audio packets includes a plurality of audio channels 1, 2, . . . and n, as shown in FIG. 2. The audio packet has a packet header appended to the head thereof.

The packet header has recorded therein a variety of control data used in, for example, audio control.

For example, a sampling frequency, the number of multiplexed channels, a crossover frequency, a data encoding system code indicating a data encoding system, and an audio-signal specification code indicating the specifications (format) of an audio-signal reproduction system are recorded in the packet header.

The format of the audio data, for example, information concerning a reproduction method (wavefront reproduction or intensity control), intervals between speakers, or the arrangement of the speakers, is recorded in the audio-signal specification code.

Each of the audio channels has a channel header appended to the head thereof, as shown in FIG. 2.

The channel header has data indicating, for example, channel numbers, frequency bands, gains, or the amount of phase shift recorded therein as additional information.

Figure 3:
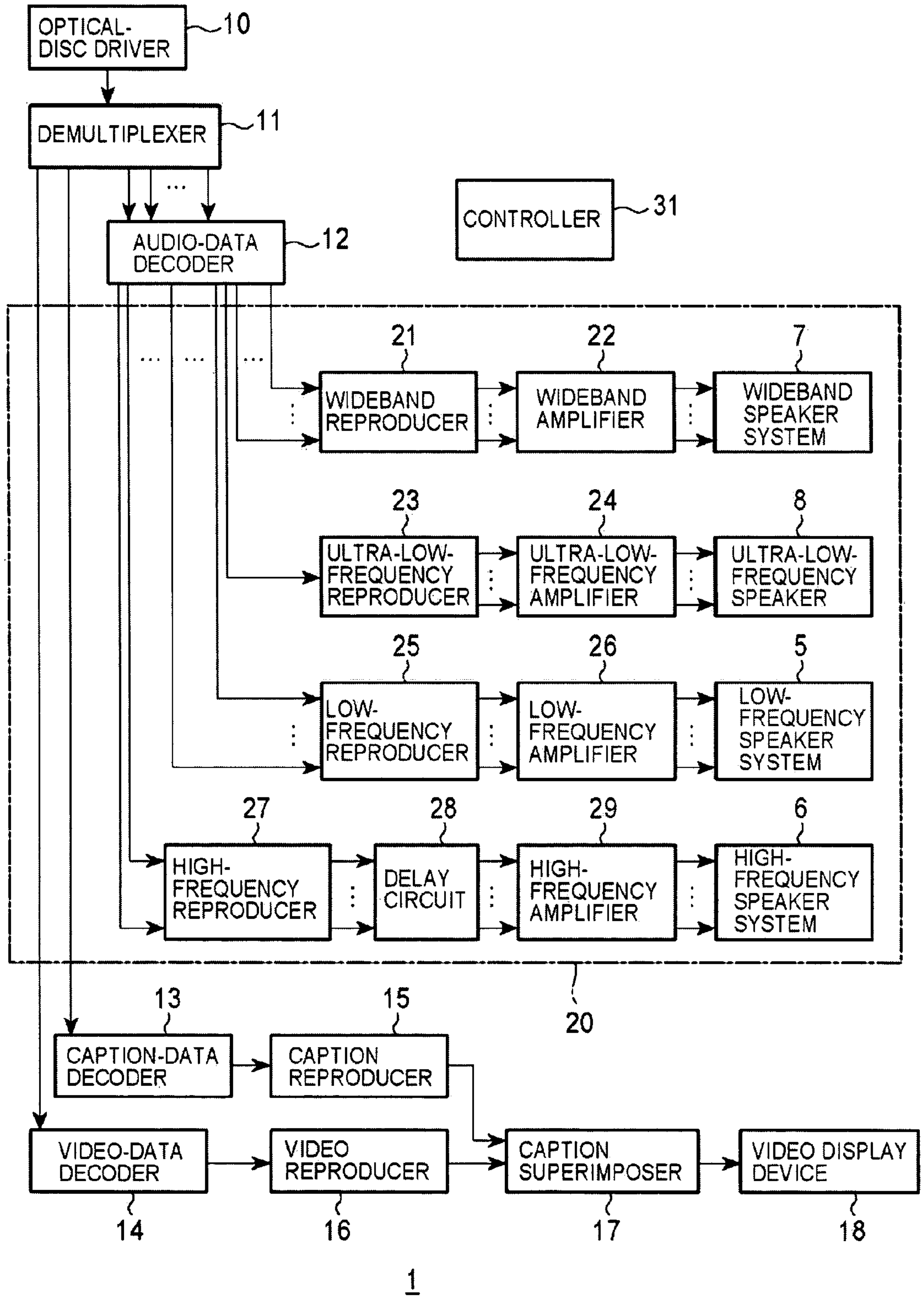
FIG. 3 is a block diagram showing a structure of an AV system according to an embodiment of the present invention.

FIG. 3 is a block diagram showing a structure of the AV system 1 described above.

Referring to FIG. 3, an optical-disc driver 10 reads multiplexed data recorded in an optical disc.

A demultiplexer 11 detects and separates a header, video data, caption data, and audio data in a plurality of channels from the readout multiplexed data.

An audio-data decoder 12 decodes the audio data transmitted from the demultiplexer 11.

The audio-data decoder 12 also adjusts the phase or amplitude level of the decoded audio data and outputs the adjusted data to a sound reproducing unit 20.

The sound reproducing unit 20 outputs wideband data, among the decoded audio data, to a wideband reproducer 21 and outputs ultra-low-frequency data to an ultra-low-frequency reproducer 23. The sound reproducing unit 20 outputs low-frequency data to a low-frequency reproducer 25 and outputs high-frequency data to a high-frequency reproducer 27.

A caption-data decoder 13 decodes the caption data from the caption packet in accordance with timing information included in header information transmitted from the demultiplexer 11 and outputs the decoded caption data. A video-data decoder 14 decodes the video data in accordance with a frame rate included in the header information transmitted from the demultiplexer 11 and outputs the decoded video data.

A caption reproducer 15 performs a desired reproduction process for the caption data decoded in the caption-data decoder 13 to output the processed caption data as a caption signal.

A video reproducer 16 performs a desired reproduction process for the video data decoded in the video-data decoder 14 to output the processed video data as a video signal.

A caption superimposer 17 performs a superimposition process, in which the caption signal is superimposed on the video signal based on timing information, such as caption control information, recorded in a packet header appended to the caption packet as header information, and converts the processed data into a video signal format corresponding to a video display device 18 to output the converted data to the video display device 18.

The video display device 18 displays video based on the video signal supplied from the caption superimposer 17.

The wideband reproducer 21 performs signal processing, such as a gain adjustment, for a plurality of pieces of wideband data supplied from the audio-data decoder 12 under the control of a controller 31 and converts the processed data into an analog signal to output the analog signal to a wideband amplifier 22 as a wideband signal.

The wideband amplifier 22 amplifies the wideband signal supplied from the wideband reproducer 21 to a predetermined level, and outputs the amplified signal to the wideband speaker system 7 to output the signal from the wideband speakers 7-1 and 7-2 in the wideband speaker system 7.

The ultra-low-frequency reproducer 23 performs signal processing, such as a gain adjustment, for ultra-low-frequency data supplied from the audio-data decoder 12 under the control of the controller 31 and outputs the processed data to an ultra-low-frequency amplifier 24 as an ultra-low-frequency signal. The ultra-low-frequency amplifier 24 amplifies the ultra-low-frequency signal supplied from the ultra-low-frequency reproducer 23 to a predetermined level and outputs the amplified signal to the ultra-low-frequency speaker 8. The ultra-low-frequency speaker 8 outputs the signal.

The low-frequency reproducer 25 performs signal processing, such as a gain adjustment, for a plurality of pieces of low-frequency data supplied from the audio-data decoder 12 under the control of the controller 31 and converts the processed data into an analog signal to output the analog signal to a low-frequency amplifier 26 as a low-frequency signal. The low-frequency amplifier 26 amplifies the low-frequency signal supplied from the low-frequency reproducer 25 to a predetermined level, and outputs the amplified signal to the low-frequency speaker system 5 to output the signal from the low-frequency speakers 5-1, 5-2, . . . in the low-frequency speaker system 5.

The high-frequency reproducer 27 performs signal processing, such as a gain adjustment, for a plurality of pieces of high-frequency data supplied from the audio-data decoder 12 under the control of the controller 31 and converts the processed data into an analog high-frequency signal to output the analog high-frequency signal to a delay circuit 28, which is timing control means.

The delay circuit 28 outputs the high-frequency signal supplied from the high-frequency reproducer 27 to a high-frequency amplifier 29 after a predetermined delay time.

The high-frequency amplifier 29 amplifies the high-frequency signal, which is supplied from the high-frequency reproducer 27 and is delayed by the predetermined delay time in the delay circuit 28, to a predetermined level, and outputs the amplified high-frequency signal to the high-frequency speaker system 6 to output the signal from the high-frequency speakers 6-1, 6-2, and 6-3 in the high-frequency speaker system 6.

The controller 31 controls the entire AV system 1 and performs various controls by using the header information separated from the multiplexed data in the demultiplexer 11.

For example, the controller 31 switches the operation of the audio-data decoder 12 based on the sampling frequency or the data encoding system code appended to the packet header shown in FIG. 2. Or, the controller 31 selects only the audio packet satisfying the specifications of the sound reproducing unit 20 from the audio-signal specification (format) code appended to the packet header.

When the audio packet 1 is an audio packet reproduced by the wavefront reproduction, the audio packet 2 is an audio packet reproduced by the intensity control, and the audio packet is an audio packet reproduced by the surround-sound reproduction, the controller 31 selects the appropriate audio packets 1 and 3.

In addition, when the number of audio channels in the audio packet does not coincide with the number of arranged speakers due to the size of the screen 2 or the listening room, the controller 31 selects necessary audio channels in accordance with the number of speakers actually arranged, that is, according to the reproduction environment, from the header information in the packet header or the channel header.

The controller 31 performs control for transmitting the audio data in the audio channels to the corresponding reproducer, that is, the wideband reproducer 21, the ultra-low-frequency reproducer 23, the low-frequency reproducer 25, or the high-frequency reproducer 27, based on the channel number of the channel header.

Furthermore, the controller 31 performs phase-shift control in the audio-data decoder 12 based on data indicating a gain and the amount of phase shift, among the data recorded in the channel header, and performs gain adjustment in the wideband reproducer 21, the ultra-low-frequency reproducer 23, the low-frequency reproducer 25, and the high-frequency reproducer 27. The phase-shift control may be performed in each of-the reproducers.

In the AV system 1 having the structure described above, the high-frequency sounds output from the high-frequency speaker system 6 can be output behind the low-frequency sounds output from the low-frequency speaker system 5 based on the audio data recorded in the recording medium including an optical disc, so that it is possible to reproduce a target wideband sound field across a wide range from lower frequencies to higher frequencies.

Although the delay circuit 28 is used as the timing control means to delay the high-frequency signals in the AV system 1 of this embodiment shown in FIG. 3, this structure is shown merely as an example. For example, the high-frequency sounds output from the high-frequency speaker system 6 may be output behind the low-frequency sounds output from the low-frequency speaker system 5 by using a decoding time stamp of the audio data appended to the packet header.

Alternatively, the high-frequency sounds may be delayed from the low-frequency sounds by, for example, adjusting the reproduction timing of the low-frequency signals and the high-frequency signals based on the positional relationship between the low-frequency speaker system 5 and the high-frequency speaker system 6 in the low-frequency reproducer 25 and the high-frequency reproducer 27.

Although at least the low-frequency data corresponding to the low-frequency speaker system 5 and the high-frequency data corresponding to the high-frequency speaker system 6 are multiplexed in the recording medium including an optical disc as the audio data reproduced by the wavefront reproduction in the AV system 1 shown in FIG. 3, this structure is shown merely as an example. For example, audio data that is not subject to bandwidth division may be recorded in the recording medium.

Figure 4:
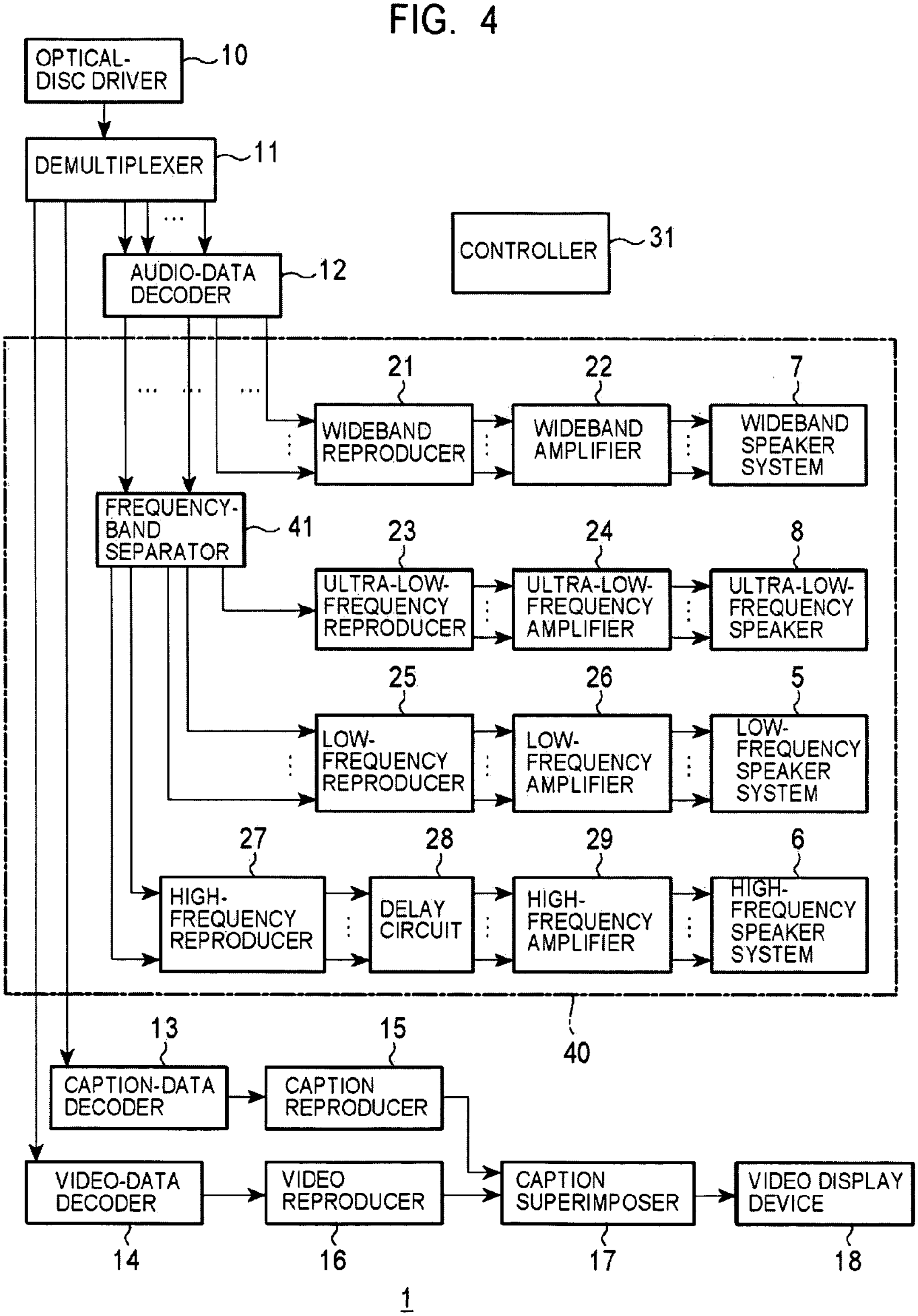
FIG. 4 is a block diagram showing another structure of the AV system according to an embodiment of the present invention.
Figure 5A:
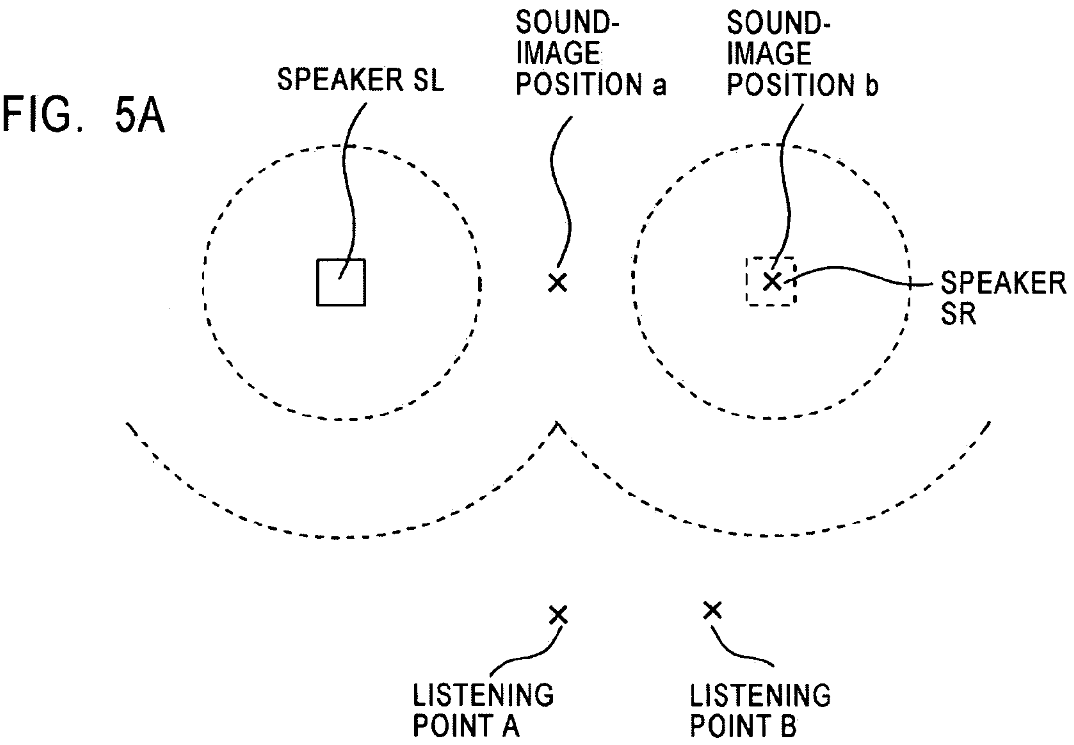
FIGS. 5A to 5C illustrate the relationship between an arrangement of speakers and binaural response characteristics of listeners at listening positions.
Figure 5B:
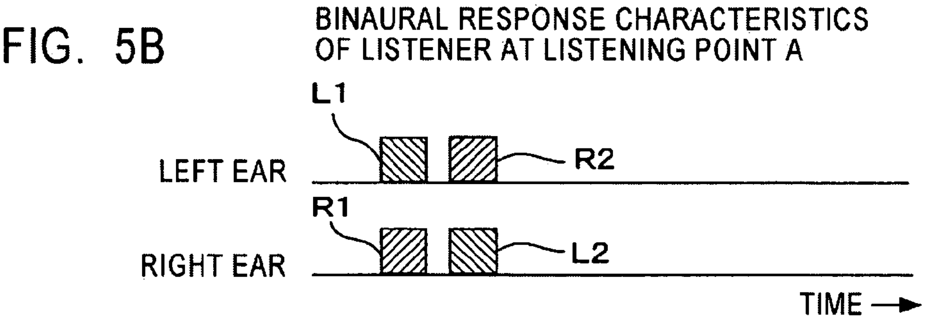
Figure 5C:
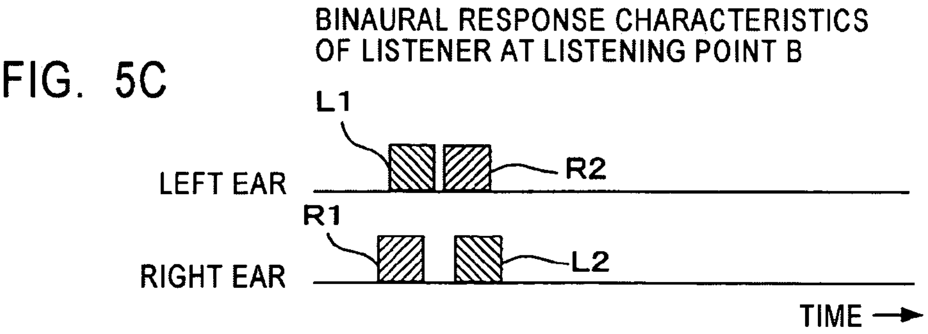
Figure 6A:
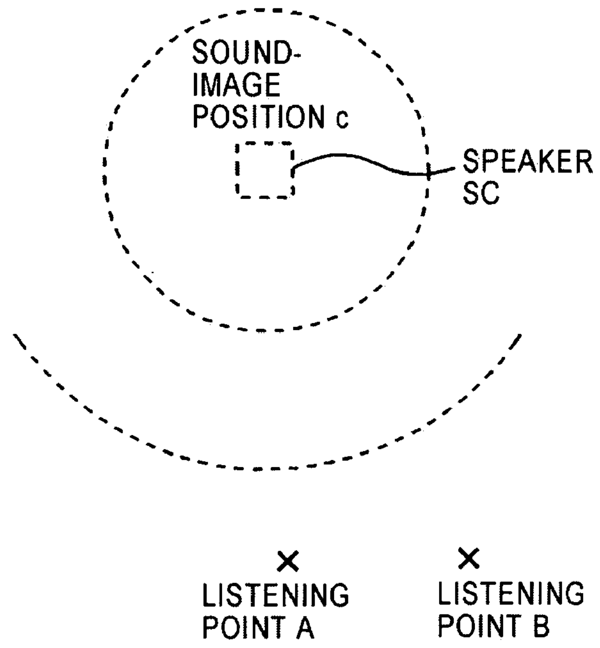
FIGS. 6A to 6C illustrate the relationship between another arrangement of speakers and the binaural response characteristics of listeners at listening positions.
Figure 6B:
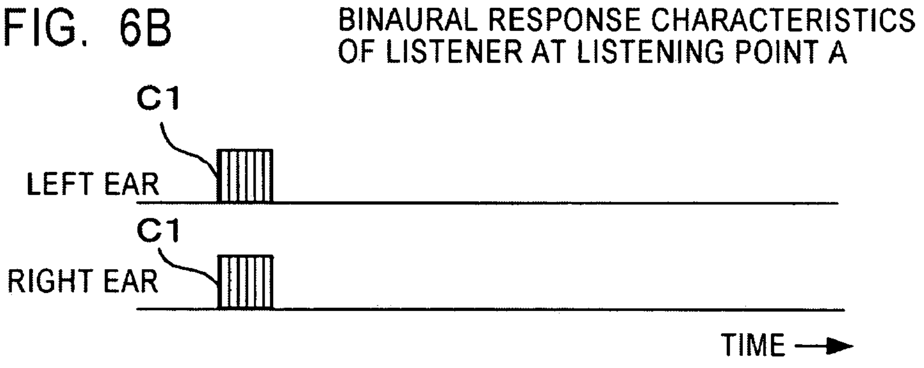
Figure 6C:
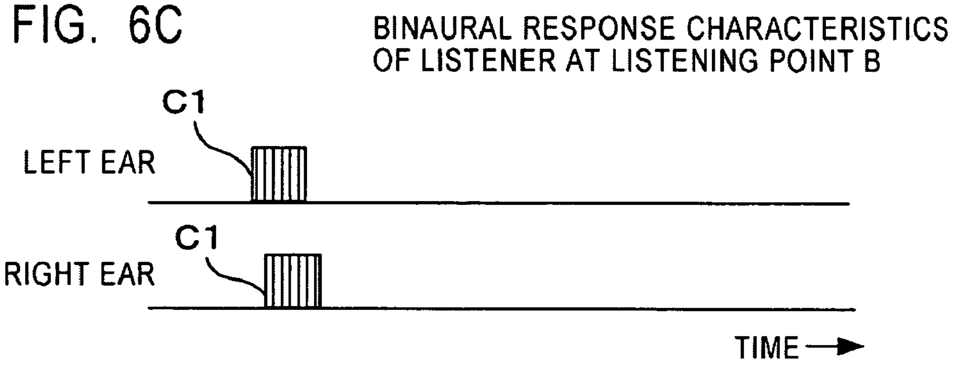

FIG. 4 is a block diagram showing the structure of an AV system in which audio data that is not subject to bandwidth division is recorded.

The same reference numerals are used in FIG. 4 to identify the same components as in FIG. 3. A detailed description of such components is omitted here.

The AV system in FIG. 4 differs from the AV system 1 in FIG. 3 in that a frequency-band separator 41 is provided between the audio-data decoder 12 and the ultra-low-frequency reproducer 23, the low-frequency reproducer 25, and the high-frequency reproducer 27. The frequency-band separator 41 separates the wideband data, which is read out from the optical disc and is decoded by the audio-data decoder 12, into high-frequency data and low-frequency data.

The high-frequency data and the low-frequency data separated by the frequency-band separator 41 are supplied to the ultra-low-frequency reproducer 23, the low-frequency reproducer 25, and the high-frequency reproducer 27.

The low-frequency reproducer 25 can control the phase shift or level of the low-frequency data separated from the wideband data to generate, by signal processing, low-frequency data capable of outputting low-frequency sounds for reproducing a target sound field from the low-frequency speaker system 5.

Although a variety of data to be reproduced, that is, the video data, the caption data, and the audio data in the multiple audio channels, are multiplexed and are recorded in the recording medium, such as an optical disc, in the AV system of the above embodiment, the AV system may be structured so as to receive the data to be reproduced, including the video data, the caption data, and the audio data in the multiple audio channels, over a network.

For example, the recording medium may be a Blu-ray disc. The recording medium is not limited to an optical disc.

The AV system having the sound reproducing apparatus according to the present invention is exemplified in the embodiments described above. According to the present invention, it is sufficient for the sound reproducing apparatus to include at least low-frequency-sound reproducing means for reproducing low-frequency signals to output low-frequency sounds, high-frequency reproducing means for reproducing high-frequency signals to output high-frequency sounds, and delay means capable of outputting the high-frequency sounds behind the low-frequency sounds.

Although the low-frequency speaker system is a speaker array including a plurality of low-frequency speakers in the above embodiment, this structure is shown merely as an example. The low-frequency speaker system may have an arbitrary structure as long as it can synthesize a wavefront of sound waves achieving absolute sound-image localization. For example, the low-frequency speaker system may include non-directional spherical speakers or it may be a simple speaker.

What is claimed is:

1. A sound reproducing apparatus comprising:

a low-frequency sound reproducing unit for reproducing and outputting a low-frequency sound having a predetermined frequency or less;

a high-frequency sound reproducing unit for reproducing and outputting a high-frequency sound including a frequency component having a frequency higher than the predetermined frequency; and a reproduction-and-output timing control unit causing the high-frequency sound to be reproduced and output by the high-frequency sound reproducing unit after the low-frequency sound is reproduced and output by the low-frequency sound reproducing unit by a predetermined time period.

2. The sound reproducing apparatus according to claim 1, wherein the low-frequency sound reproducing unit is structured to include a plurality of speakers arranged at intervals that are not more than half of a wavelength of a sound wave determined by the predetermined frequency.

3. A sound reproducing method comprising:

a low-frequency sound reproducing step of reproducing and outputting a low-frequency sound having a predetermined frequency or less;

a high-frequency sound reproducing step of reproducing and outputting a high-frequency sound including a frequency component having a frequency higher than the predetermined frequency; and a reproduction-and-output timing control step of causing the high-frequency sound to be reproduced and output in the high-frequency sound reproducing step after the low-frequency sound is reproduced and output in the low-frequency sound reproducing step by a predetermined time period.

4. The sound reproducing method according to claim 3, wherein the reproduction-and-output timing control step includes the step of arranging a high-frequency speaker for reproducing and outputting the high-frequency sound closer to a listener than a low-frequency speaker for reproducing and outputting the low-frequency sound.

* * * * *